(12) United States Patent
Hasegawa et al.

(10) Patent No.: US 7,110,256 B2
(45) Date of Patent: Sep. 19, 2006

(54) COMMUNICATION DEVICE

(75) Inventors: Yuuji Hasegawa, Kawasaki (JP);
Kazuo Hirafuji, Kawasaki (JP);
Toshimitsu Kobayashi, Kawasaki (JP);
Manabu Miyamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 273 days.

(21) Appl. No.: 10/731,185

(22) Filed: Dec. 9, 2003

(65) Prior Publication Data

US 2004/0190249 A1 Sep. 30, 2004

(30) Foreign Application Priority Data

Dec. 11, 2002 (JP) ............................. 2002-359031

(51) Int. Cl.
*H05K 7/20* (2006.01)
(52) U.S. Cl. ................... 361/697; 361/687; 361/699; 165/80.3; 455/347
(58) Field of Classification Search ................ 361/697, 361/700, 724, 725, 727; 219/486; 165/80.3, 165/80.2, 104.33; 379/428; 455/347
See application file for complete search history.

(56) References Cited

U.S. PATENT DOCUMENTS

| 5,285,347 | A |   | 2/1994 | Fox et al. |
| 5,548,643 | A | * | 8/1996 | Dalgleish et al. ........... 379/429 |
| 5,793,611 | A | * | 8/1998 | Nakazato et al. ........... 361/704 |
| 6,050,327 | A | * | 4/2000 | Gates ........................ 165/80.3 |
| 6,084,772 | A | * | 7/2000 | Pell et al. .................... 361/699 |
| 6,127,660 | A | * | 10/2000 | Scafati ....................... 219/486 |
| 6,542,049 | B1 | * | 4/2003 | Henningsson et al. ...... 333/132 |
| 6,640,084 | B1 | * | 10/2003 | Pande et al. ............... 455/3.01 |
| 2002/0160742 | A1 | * | 10/2002 | Hasegawa et al. .......... 455/347 |

FOREIGN PATENT DOCUMENTS

| DE | 101 32 311 |   | 9/2002 |
| JP | 64-28896 |   | 1/1989 |
| JP | 6-310883 |   | 11/1994 |
| JP | 6-334374 |   | 12/1994 |
| JP | 11-298180 |   | 10/1999 |
| JP | 2001-127473 |   | 5/2001 |
| JP | 02001358488 | A * | 12/2001 |
| WO | WO 9960709 | * | 11/1999 |

OTHER PUBLICATIONS

European Search Report dated Jun. 27, 2005.

* cited by examiner

*Primary Examiner*—Michael Datskovskiy
(74) *Attorney, Agent, or Firm*—Katten Muchin Rosenman LLP

(57) ABSTRACT

A communication device which efficiently dissipates locally generated heat, and at the same time is small in size and light in weight, is provided. A high-efficiency heat-dissipating fin section having fins disposed on an heat pipe which is bent into an S shape is mounted on a high-temperature heat-generating section that generates high-temperature heat. A heat-dissipating fin section having fins disposed on a heat-receiving plate thereof is mounted on a low-temperature heat-generating section that generates heat having a lower temperature than that of the high-temperature heat generated by the high-temperature heat-generating section. This makes it possible to efficiently dissipate heat and reduce the size and weight of the communication device.

6 Claims, 19 Drawing Sheets

COMMUNICATION DEVICE

BACKGROUND OF THE INVENTION (1) Field of the Invention

This invention relates to a communication device provided in a base station for cellular phones, and more particularly to a communication device which generates heat.

(2) Description of the Related Art

The usage rate of cellular phones has been becoming so high that communication devices used in base stations are demanded to be higher in output. Communication devices higher in output generate larger amounts of heat, which affect reliability of operations thereof. Therefore, how to attain efficient heat dissipation is a key problem of recent communication devices. Provision of heat-dissipating fins is among conventional solutions thereto.

In conventional communication devices, a single heat-dissipating fin section, for example, is provided for each heat-generating electronic module (see e.g. page 3 and FIGS. 1 and 2 of Japanese Unexamined Patent Publication No. 6-310883). Further, on electronic modules different in the amount of heat generation, there are mounted respective single heat-dissipating fin sections which are different in the height of fins (see e.g. page 6 and FIG. 10 of Japanese Unexamined Patent Publication No. 11-298180).

FIG. 17 is a perspective view showing an example of a conventional communication device having a heat-dissipating fin section attached thereto. FIG. 18 is an exploded perspective view of the conventional communication device shown in FIG. 17 with a digital distortion-compensating unit and a converter unit removed therefrom. FIG. 19 is an exploded perspective view of the conventional communication device with a power supply unit further removed from the apparatus in the state shown in FIG. 18.

As shown in FIGS. 17 to 19, the communication device 100 is comprised of a heat-dissipating fin section 101, a digital distortion-compensating unit 102, a converter unit 103, power supply units 104, 105, a power amplifier unit 106, and a front panel 107.

The heat-dissipating fin section 101 is comprised of an aluminum heat-receiving plate and a plurality of aluminum fins protruding therefrom. The power supply unit 105 and the power amplifier unit 106 are mounted on the heat-receiving plate. The heat-dissipating fin section 101 dissipates heat generated by the power supply unit 105 and the power amplifier unit 106. The heat-dissipating fin section 101 has a generally rectangular parallelepiped shape, and extends over the entire surface of one side of the communication device 100.

The digital distortion-compensating unit 102 is a printed board on which is mounted a circuit for compensating for distortions of a digital signal. The digital distortion-compensating unit 102 is mounted on the heat-dissipating fin section 101 in a manner covering the power supply unit 104 mounted on the heat-dissipating fin section 101.

The converter unit 103 is a printed board on which is mounted a circuit for frequency conversion of a signal.

The power supply unit 104 is a printed board on which is mounted a circuit for supplying power to circuits. The power supply unit 105 is a packaged power supply module which supplies power to circuits. The power supply unit 104 is mounted on the heat-dissipating fin section 101 in a manner covering the power supply unit 105 and the power amplifier unit 106 mounted on the heat-dissipating fin section 101.

The power amplifier unit 106 is an L-shaped printed board on which is mounted a circuit for amplifying a high-frequency signal. This printed board has power transistors mounted thereon for amplifying the high-frequency signal.

The front panel 107 is a panel attached to a front side of the communication device 100 when it is received in the rack.

Heat generated by the power supply unit 105 and the power amplifier unit 106 is dissipated by the heat-dissipating fin section 101, whereby the temperature of the communication device 100 is prevented from rising beyond a predetermined temperature. In the communication device 100 constructed as above, when the amount of heat generated by the power supply unit 105 and the power amplifier unit 106 is increased, it is necessary to increase the area of the heat-receiving plate of the heat-dissipating fin section 101, and the height and length of the fins to enhance the heat dissipation efficiency.

Now, heat emitted from power transistors is very large, and by far larger than heat emitted from power supply circuits or the like. Therefore, heat emitted from the power amplifier unit 106 having the power transistors mounted thereon is larger than heat emitted from the power supply unit 105, which prevents heat from being uniformly distributed in the heat-receiving plate of the heat-dissipating fin section 101. Further, non-uniform heat distribution is also caused depending on the mounting locations of the power transistors. Therefore, to simply increase the size of the heat-dissipating fin section 101 is not enough, for example, to realize uniform heat distribution all over the heat-dissipating fin section 101 and conduction of heat to the distal ends of fins.

As described above, although the size of the heat-dissipating fin section is increased for coping with an increase in the amount of heat generation caused by the increased output, heat locally emitted from the heat-generating portions of the apparatus is not uniformly conducted to the entire heat-dissipating fin section, so that some fins do not serve the function of dissipating heat, which degrades the heat dissipation efficiency. Further, there is a demand for a communication device small in size and weight so as to facilitate maintenance and mounting of the apparatus in a rack.

SUMMARY OF THE INVENTION

The present invention has been made in view of the above circumstances, and an object thereof is to provide a communication device which efficiently dissipates heat locally emitted from heat-generating portions, and at the same time is small in size and weight.

To attain the above object, the present invention provides a communication device that generates heat. The communication device according the present invention is characterized by comprising a high-temperature heat-generating section that generates high-temperature heat, a first heat-dissipating fin section mounted on said high-temperature heat-generating section, said first heat-dissipating fin section having a heat pipe and fins provided on said heat pipe, a low-temperature heat-generating section that generates low-temperature heat having a lower temperature than that of the high-temperature heat generated by said high-temperature heat-generating section, and a second heat-dissipating fin section mounted on said low-temperature heat-generating section, said second heat-dissipating fin section having a heat-receiving plate, and fins provided on said heat-receiving plate.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
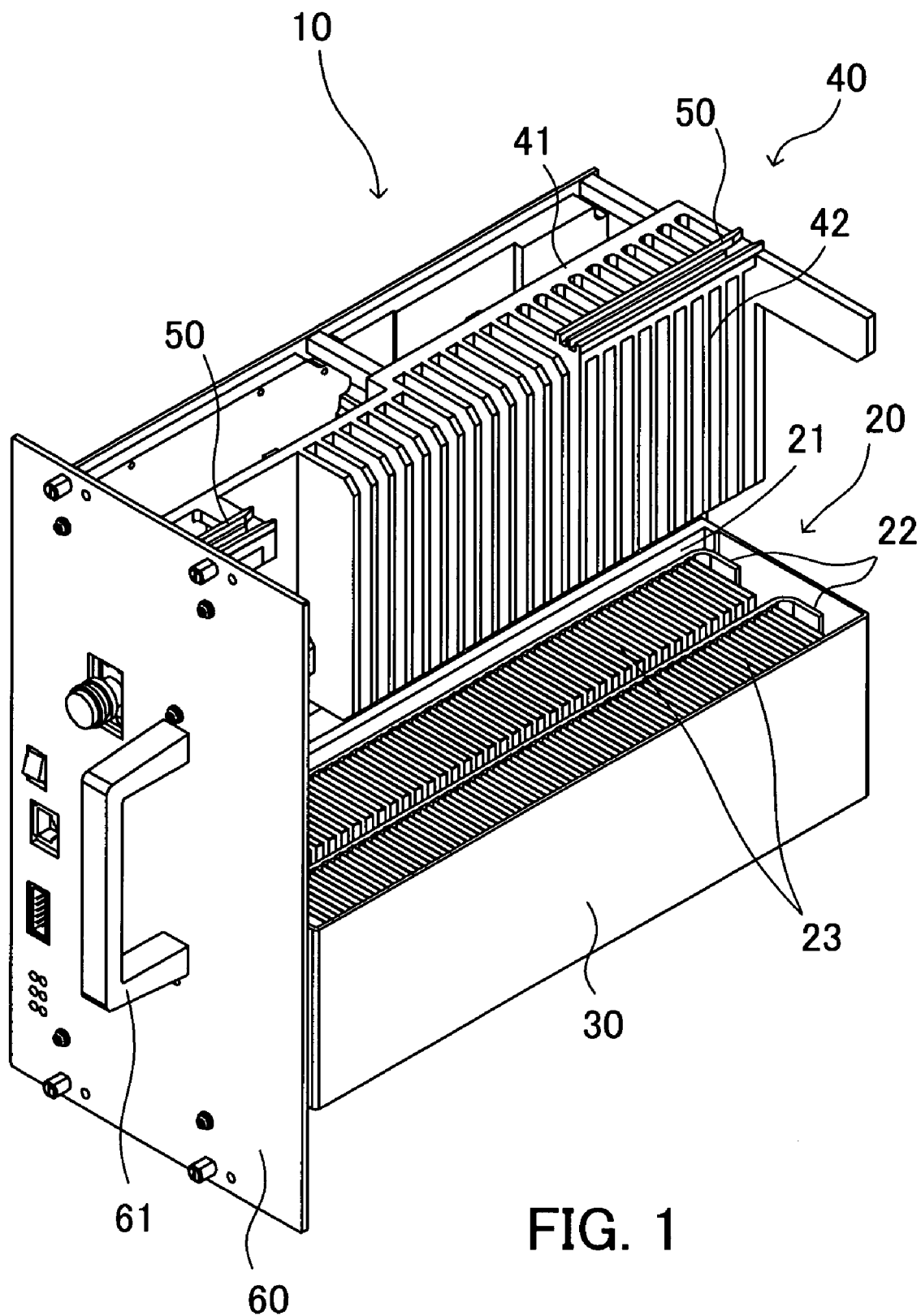
FIG. 1 is a perspective view of a communication device according to the present invention as viewed from the right side of the front thereof.
Figure 2:
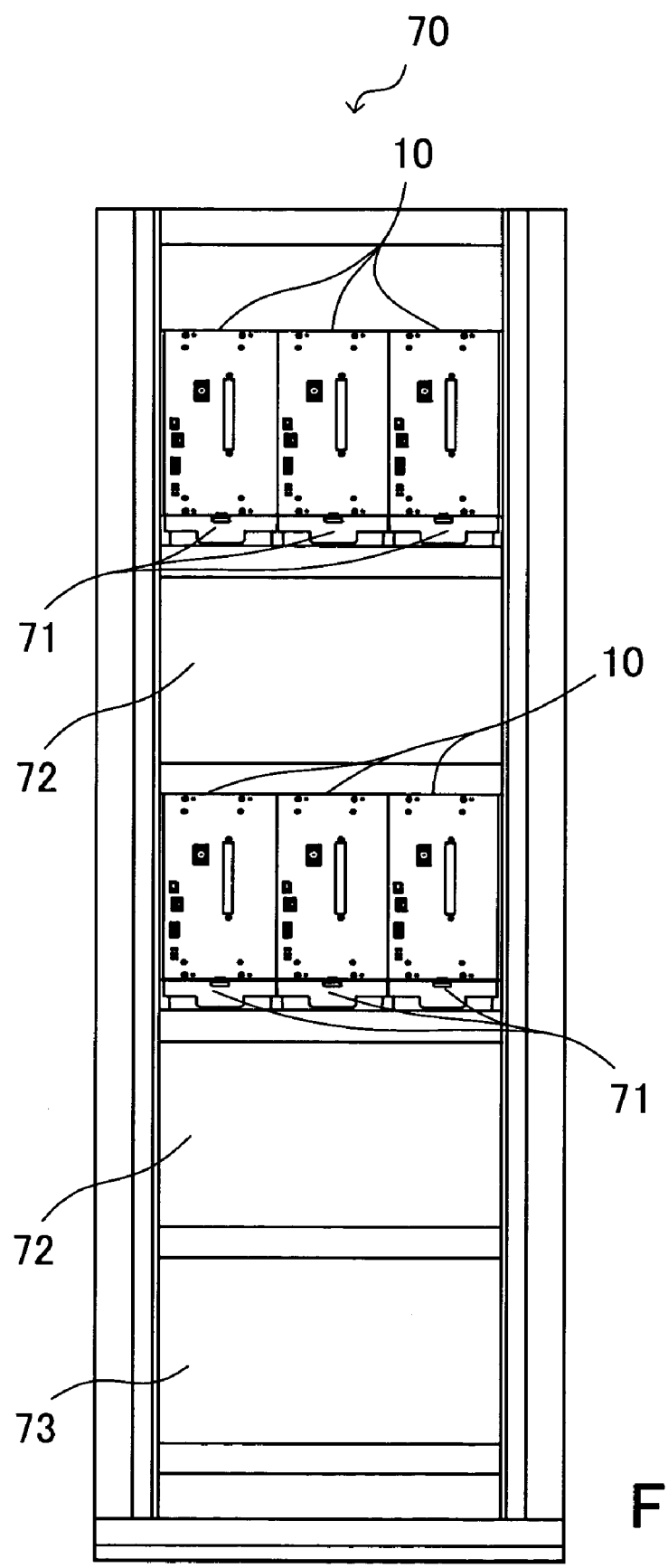
FIG. 2 is a front view of a rack containing the communication device shown in FIG. 1.

The invention will now be described in detail with reference to the drawings showing a preferred embodiment thereof. FIG. 1 is a perspective view of a communication device according to the present invention as viewed from the right side of the front thereof. FIG. 2 is a front view of a rack containing the communication device shown in FIG. 1.

The communication device 10 shown in FIG. 1 is comprised of a high-efficiency heat-dissipating fin section 20, a protection cover 30, a heat-dissipating fin section 40, a guide rail 50, and a front panel 60.

The high-efficiency heat-dissipating fin section 20 is mounted on or provided for a high-temperature heat-generating section including a circuit module or a printed board on which are mounted parts that generate high-temperature heat. The high-efficiency heat-dissipating fin section 20 includes a heat-receiving plate 21 in contact with the high-temperature heat-generating section, for receiving heat therefrom, a heat pipe 22 brazed to the heat-receiving plate 21 for heat transport, and fins 23 brazed to the heat pipe 22, for dissipating the heat transported thereby. The high-efficiency heat-dissipating fin section 20 transports the heat from the heat-receiving plate 21 to all the fins 23 via the heat pipe 22 to thereby efficiently dissipate the heat.

The protection cover 30 covers the fins 23 of the high-efficiency heat-dissipating fin section 20 and is rigidly fixed to the heat-receiving plate 21. The protection cover 30 is provided for preventing damages to the high-efficiency heat-dissipating fin section 20 e.g. due to contact of the fin section 20 with an external object.

The heat-dissipating fin section 40 is mounted on a low-temperature heat-generating section including circuit modules and/or printed boards on which are mounted parts that generate low-temperature heat lower in temperature than that of the high-temperature heat generated by the high-temperature heat-generating section. The heat-dissipating fin section 40 includes a heat-receiving plate 41 in contact with the low-temperature heat-generating section, for receiving the heat therefrom, and fins 42 crimped to part of the heat-receiving plate 41. It should be noted that the heat-dissipating fin section 40 is an aluminum heat-dissipating fin section (crimped fins) in general use. The heat-dissipating fin section 40 has a guide rail 50 attached thereto for positioning the communication device 10 when the communication device 10 is received in the rack 70 shown in FIG. 2.

The heat-receiving plate 41 of the heat-dissipating fin section 40 forms a body of the communication device 10. The circuit modules and/or printed boards which generate high-temperature heat or low-temperature heat are secured to a surface of the heat-receiving plate 41 opposite to a surface thereof from which the fins 42 protrude. Further, the heat-receiving plate 41 extends toward the high-efficiency heat-dissipating fin section 20 and has the heat-receiving plate 21 of the fin section 20 secured thereto.

The front panel 60 is fixed to the heat-receiving plate 41 of the heat-dissipating fin section 40. The front panel 60 has a grip 61 attached thereto, for enabling the communication device 10 to be easily pushed in and drawn out from the rack 70 shown in FIG. 2.

As described above, on the high-temperature heat-generating section that generates high-temperature heat, there is mounted the high-efficiency heat-dissipating fin section 20 having the fins 23 brazed to the heat pipe 22 thereof, for efficient heat dissipation, while on the low-temperature heat-generating section that generates the low-temperature heat lower in temperature than that of the high-temperature heat generated by the high-temperature heat-generating section, there is mounted the heat-dissipating fin section 40 having the fins 42 crimped to the heat-receiving plate 41 thereof, for heat dissipation. This makes it possible to efficiently dissipate locally generated heat, without producing portions to which the locally generated heat is not properly transported, which can be caused by an increase in the size of the heat heat-dissipating fin section.

Further, since the high-temperature heat generated on the high-temperature heat-generating section is dissipated by the high-efficiency heat-dissipating fin section 20, the heat-dissipating fin section 40 is only required to have a shape suitable for dissipating the heat generated by the low-temperature heat-generating section. This makes it possible to decrease the size of the communication device.

The rack 70 shown in FIG. 2 is installed on a base station for cellular phones. The rack 70 accommodates a plurality of the above described communication devices 10, which amplify radio signals for transmission. The rack 70 is provided with cooling fans 71 for blowing wind (cooling air) from below for air-cooling the communication devices 10. Further, the rack 70 has received signal-amplifying sections 72 for amplifying received radio signals, and a control section 73 for controlling the communication devices 10 and the received signal-amplifying sections 72.

Figure 3:
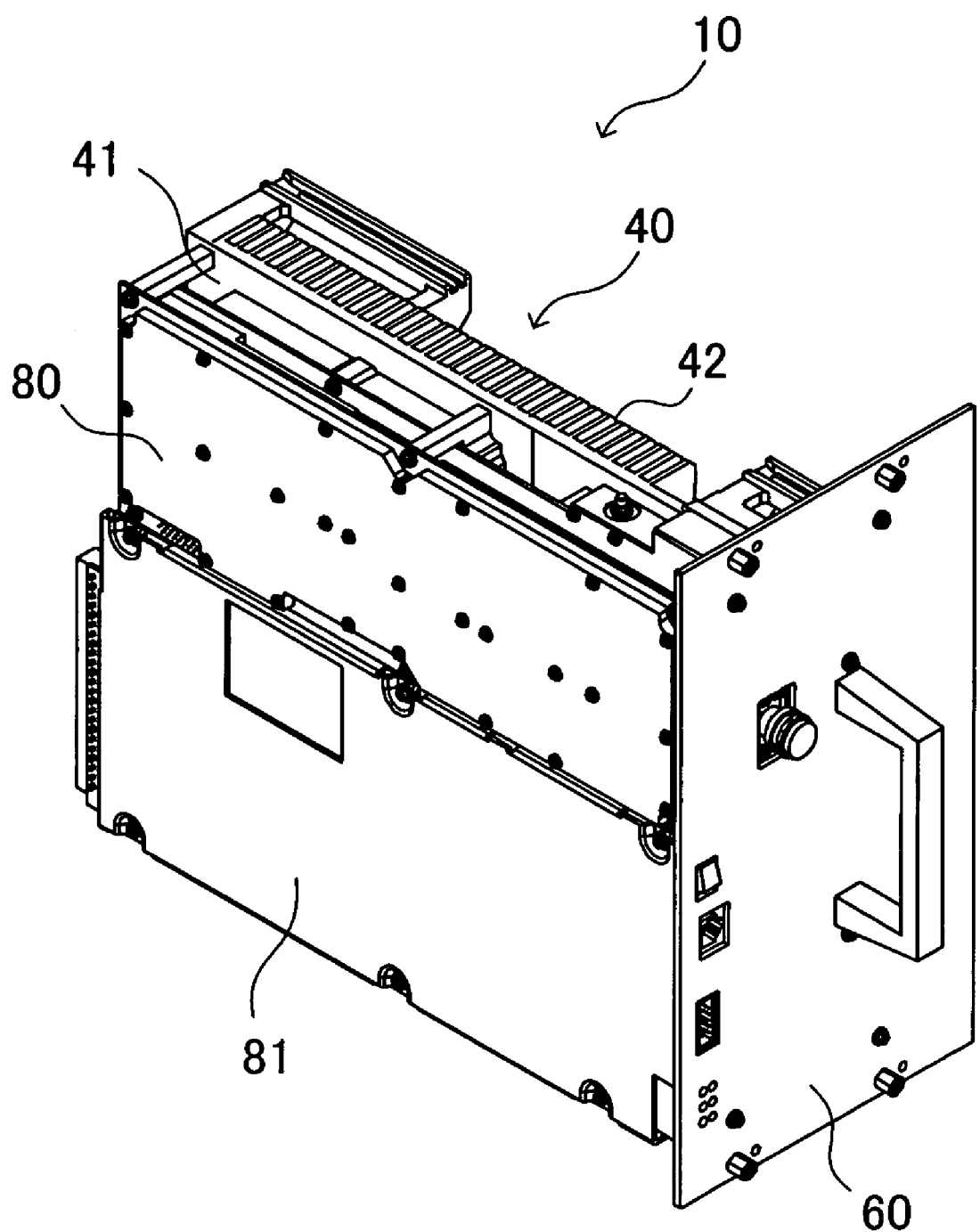
FIG. 3 is a perspective view of the communication device according to the present invention as viewed from the left side of the front thereof.

FIG. 3 is a perspective view of the communication device according to the present invention as viewed from the left side of the front thereof. As shown in FIG. 3, in the communication device 10, the heat-receiving plate 41 of the heat-dissipating fin section 40 has bosses arranged on the surface opposite to the surface from which the fins 42 protrude, and a converter unit 80, and a digital distortion-compensating unit 81 are secured to the opposite surface with screws. The converter unit 80 is a printed board on which is mounted a circuit for frequency conversion of a signal. The digital distortion-compensating unit 81 is a printed board on which is mounted a circuit for compensating for distortions of a digital signal.

Figure 4:
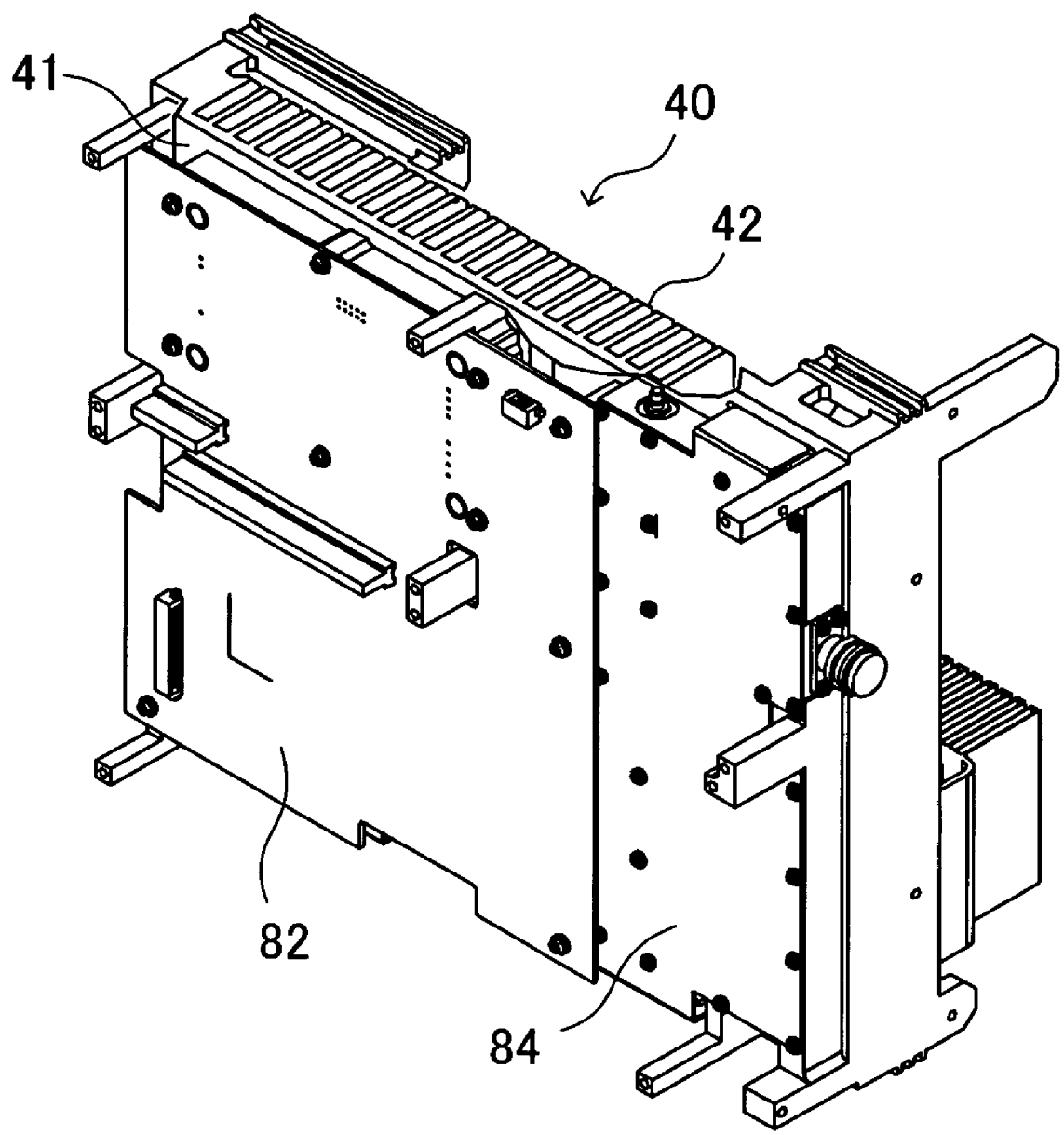
FIG. 4 is a perspective view of the communication device with a converter unit and a digital distortion-compensating unit appearing in FIG. 3 being removed therefrom.

It should be noted that although the position of the guide rail shown in FIG. 3, and FIG. 4 to FIG. 8, referred to hereinafter, is different from that of the guide rail appearing in FIG. 1, the guide rail may be disposed as shown in FIG. 3 and FIG. 4.

Figure 5:
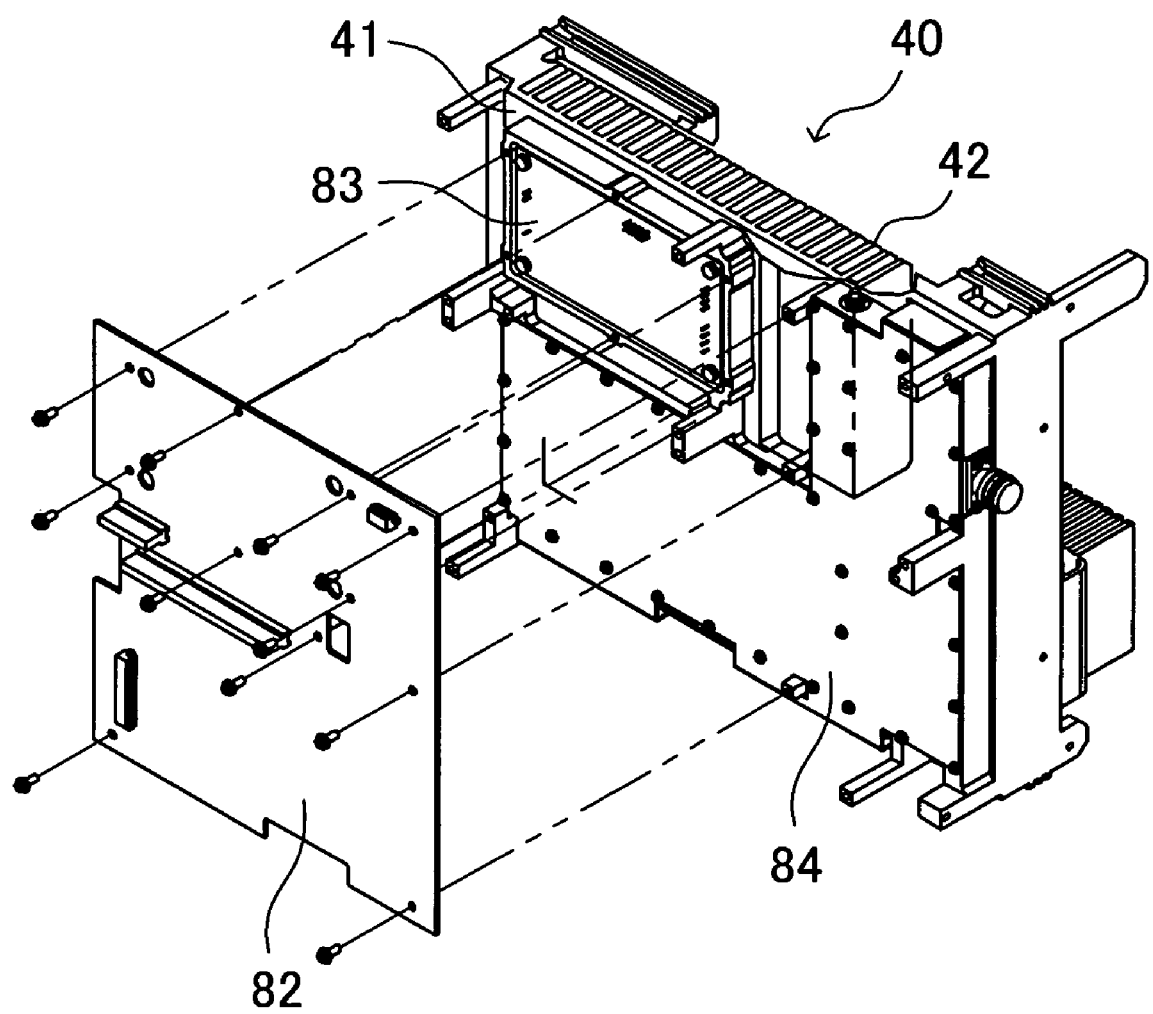
FIG. 5 is an exploded perspective view of the communication device shown in FIG. 4.

FIG. 4 is a perspective view of the communication device with the converter unit and digital distortion-compensating unit removed from the device in the state shown in FIG. 3. FIG. 5 is an exploded perspective view of the communication device shown in FIG. 4. When the converter unit 80, digital distortion-compensating unit 81, and front panel 60 appearing in FIG. 3 are removed, the communication device appears as shown in FIG. 4.

As shown in FIGS. 4 and 5, the heat-receiving plate 41 of the heat-dissipating fin section 40 has the bosses formed on the surface opposite to the surface from which the fins 42 protrude, and a power supply unit 82 is secured to the opposite surface with screws. The power supply unit 82 is a printed board on which is mounted a circuit for supplying power to circuits.

Further, a power supply unit 83 having a generally rectangular parallelepiped shape and an L-shaped cover 84 are secured to the surface of the heat-receiving plate 41 opposite to the surface from which the fins 42 protrude, with screws.

Figure 6:
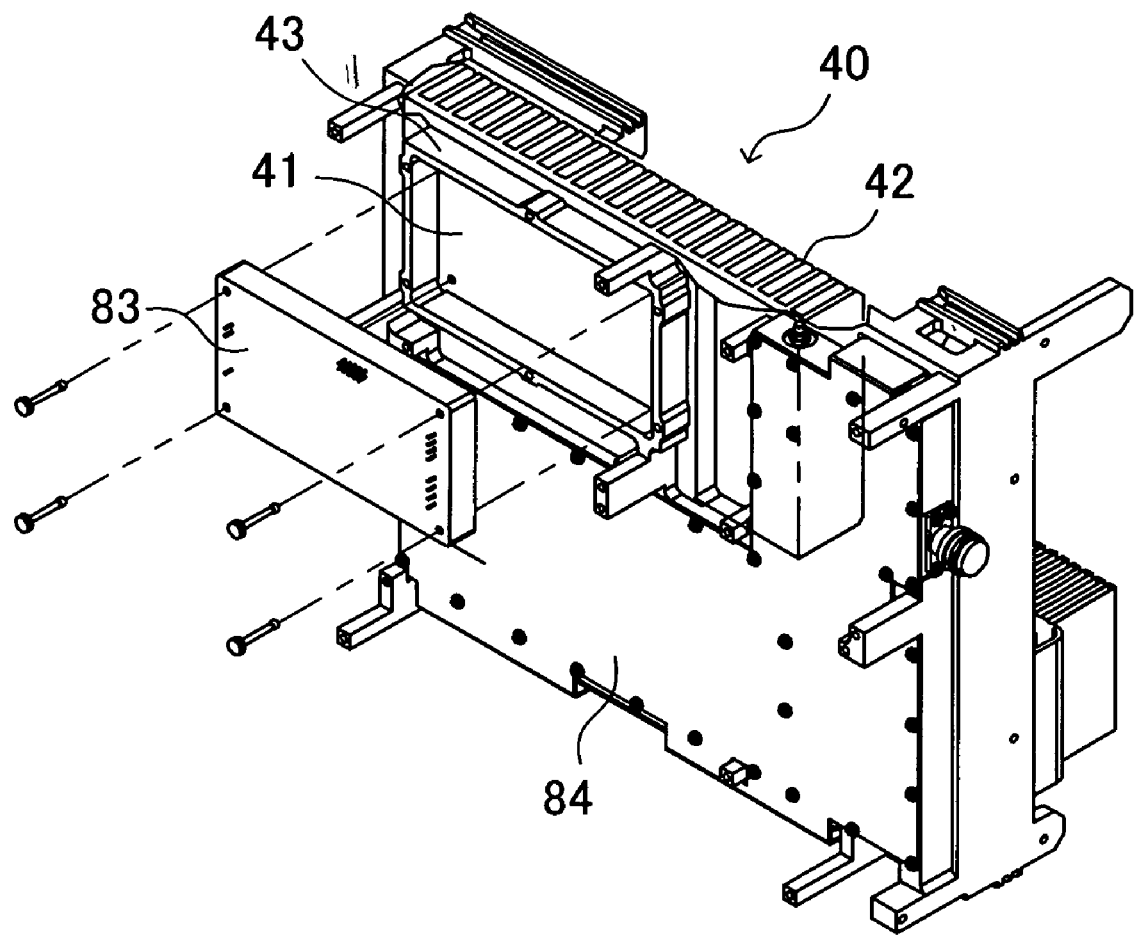
FIG. 6 is an exploded perspective view of the communication device in a state in which the power supply unit appearing in FIG. 5 is removed therefrom.

FIG. 6 is an exploded perspective view of the communication device with the power supply unit being removed from the state shown in FIG. 5. As shown in the figure, on the surface of the heat-receiving plate 41 of the heat-dissipating fin section 40 opposite to the surface from which the fins 42 protrude, there is formed a rectangular frame 43 for receiving the power supply unit 83 therein. The frame 43 is formed in contraposition with the fins 42.

The power supply unit 83 is a packaged power supply module for supplying power to circuits. The power supply unit 83 is in direct contact with the heat-receiving plate 41, and secured to the same with screws.

The fins 42 protrude from a location of the heat-receiving plate 41 opposite to a location to which the power supply unit 83 is secured. Due to this construction, heat generated by the power supply unit 83 is conducted to the heat-receiving plate 41, and dissipated through the fins 42.

Figure 7:
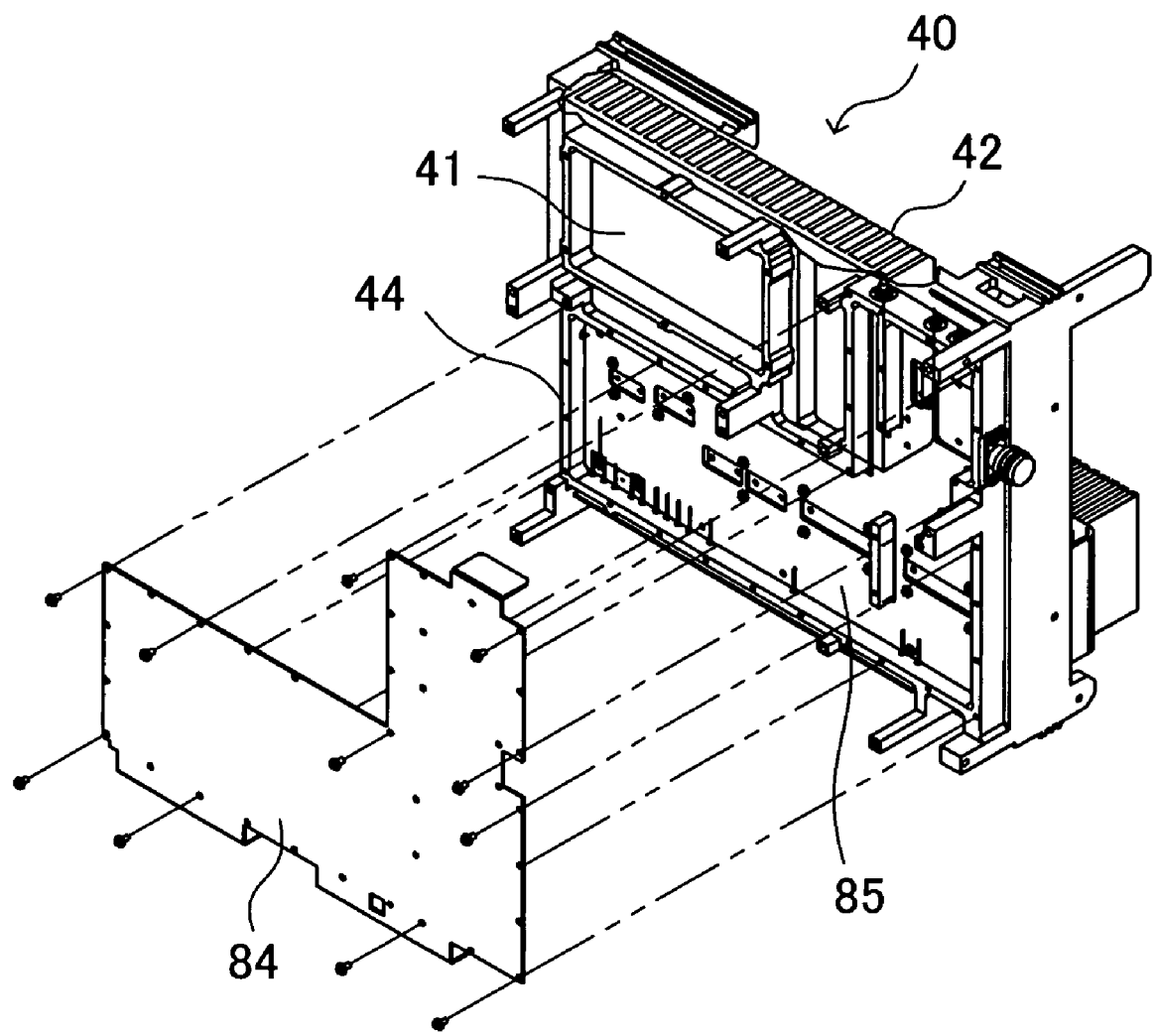
FIG. 7 is an exploded perspective view of the communication device in a state in which the cover appearing in FIG. 6 is removed therefrom.

FIG. 7 is an exploded perspective view of the communication device with the cover appearing in FIG. 6 being removed therefrom. As shown in FIG. 7, the heat-receiving plate 41 of the heat-dissipating fin section 40 has an L-shaped frame 44 formed on the surface thereof opposite to the surface from which the fins 42 protrude. The frame 44 is configured to be covered by the cover 84, and has a high-frequency board 85 fixed to the inside thereof.

Figure 8:
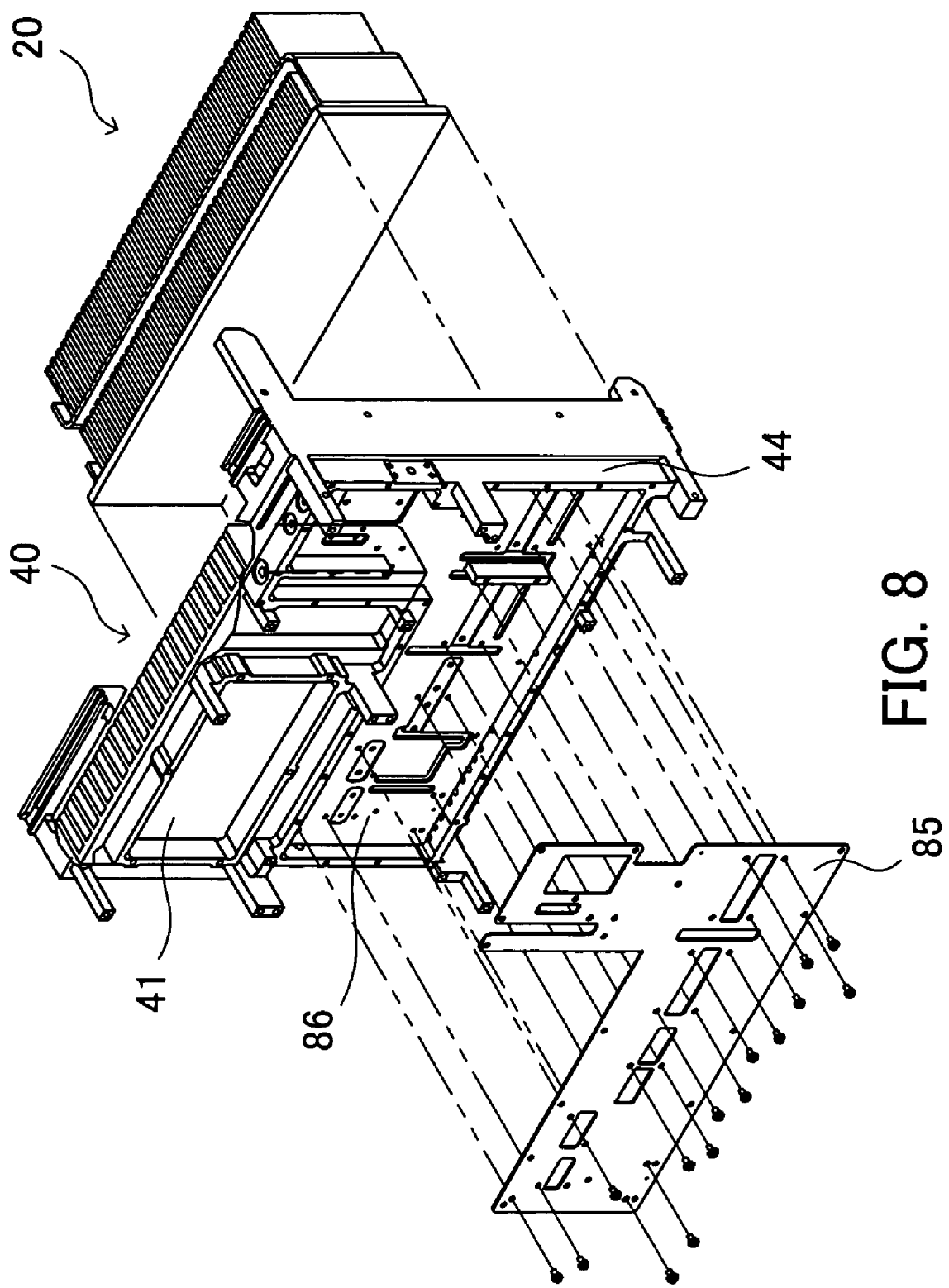
FIG. 8 is an exploded perspective view of the communication device in a state in which a high-frequency board and a high-efficiency heat-dissipating fin section appearing in FIG. 7 are removed therefrom.

FIG. 8 is an exploded perspective view of the communication device with the high-frequency board and high-efficiency heat-dissipating fin section appearing in FIG. 7 being removed therefrom. As shown in FIG. 8, when the high-frequency board 85 is removed, there appears a power amplifier unit 86 secured to the inside of the frame 44.

The power amplifier unit 86 is an L-shaped printed board on which is mounted a circuit for amplifying a high-frequency signal. The power amplifier unit 86 has power transistors mounted thereon for amplifying the high-frequency signal. Some of the power transistors which are high in output generate heat having a temperature by far higher than heat generated by the power supply unit 83.

The power amplifier unit 86 and the high-efficiency heat-dissipating fin section 20 are rigidly fixed to the heat-receiving plate 41 of the heat-dissipating fin section 40 in a manner opposed to each other with the heat-receiving plate 41 interposed therebetween. Due to this construction, heat generated by the power amplifier unit 86 is dissipated by the high-efficiency heat-dissipating fin section 20.

Figure 9:
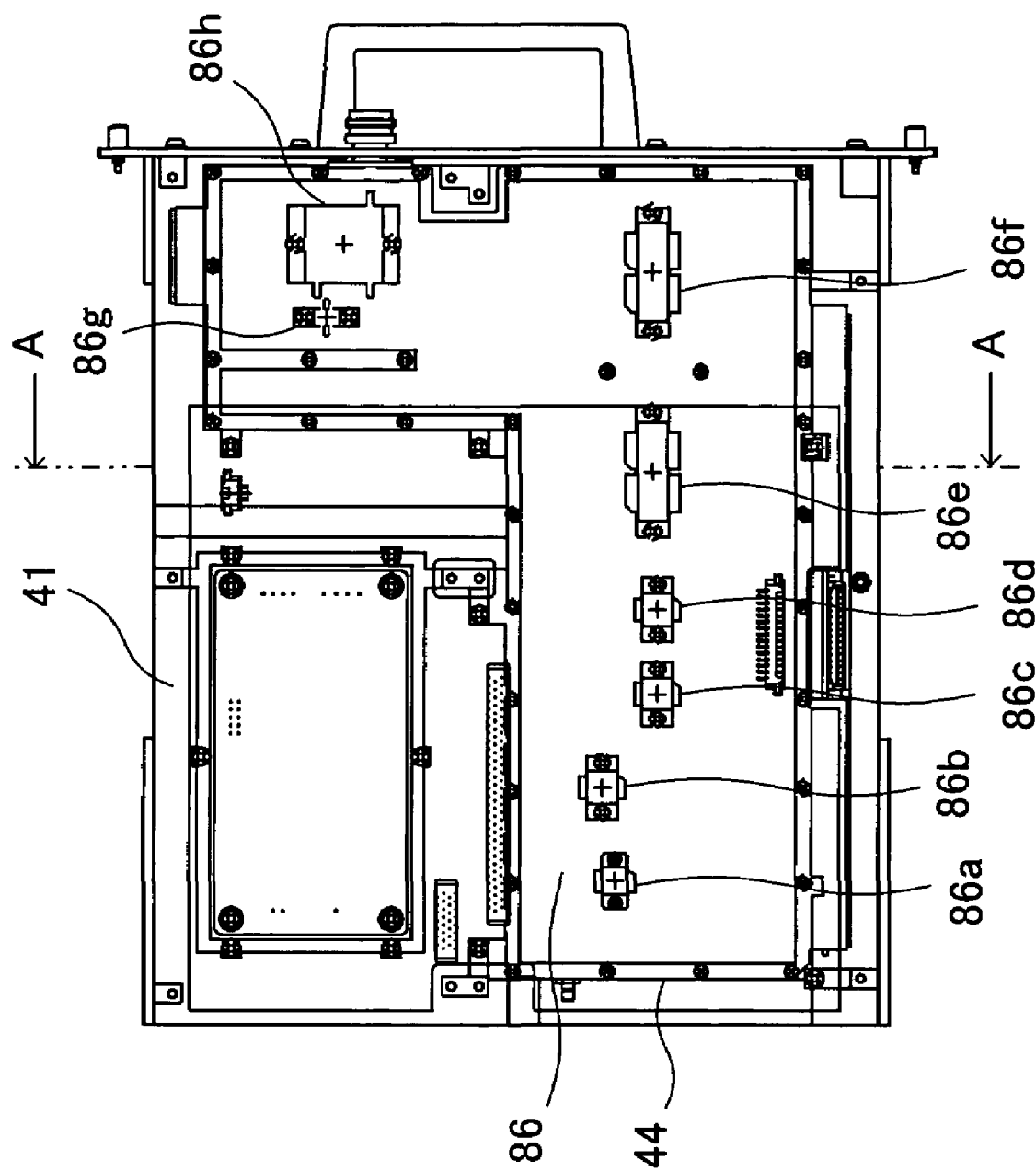
FIG. 9 is a side view of the communication device, which is useful in explaining the layout of power transistors.

FIG. 9 is a side view of the communication device, which shows the layout of the power transistors mounted therein. As shown in FIG. 9, the L-shaped power amplifier unit 86 is rigidly fixed to the inside of the frame 44 of the heat-receiving plate 41. The power amplifier unit 86 has the transistors 86*a* to 86*h* mounted thereon. The power amplifier unit 86 generates heat as a sum of respective portions of heat generated by the transistors 86*a* to 86*h* which locally generate heat having very high temperatures. The heat locally generated by the transistors 86*a* to 86*f* is dissipated by the high-efficiency heat-dissipating fin section 20.

Figure 10:
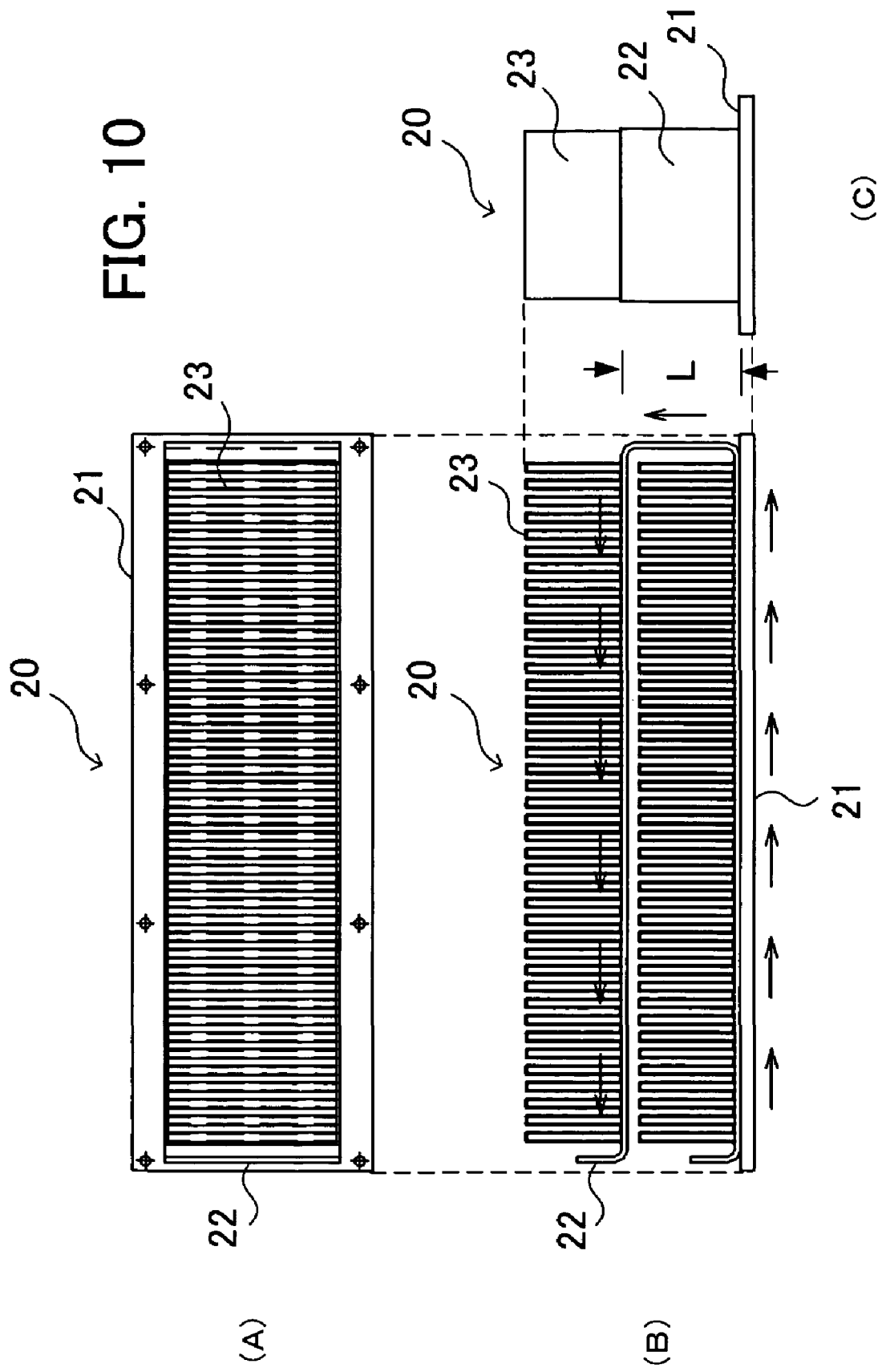
FIG. 10 is a diagram which is useful in explaining the high-efficiency heat-dissipating fin section, in which (A) of FIG. 10 is a top view of the high-efficiency heat-dissipating fin section, (B) of FIG. 10 is a front view of the same, and (C) of FIG. 10 is a side view of the same.

FIG. 10 is a diagram which is useful in explaining the high-efficiency heat-dissipating fin section, in which (A) of FIG. 10 is a top view of the high-efficiency heat-dissipating fin section, (B) of FIG. 10 is a front view of the same, and (C) of FIG. 10 is a side view of the same.

As shown in FIG. 10, the high-efficiency heat-dissipating fin section 20 has the fins 23 rigidly fixed to the heat pipe 22 by brazing such that the fins 23 are disposed perpendicularly to the plane of the heat pipe 22. It is preferred from a space-saving point of view that the heat pipe 22 is bent such that e.g. two or more layers (three layers, four layers, . . . ) of fins can be arranged on the heat pipe. In this case, in addition to a configuration of no fins being arranged at a bent portion (portion bent for connecting the above layers to each other, as shown in (B) of FIG. 10) of the heat pipe, it is possible to contemplate a configuration in which fins are also arranged at the bent portion. It should be noted that in the illustrated example, the length (represented by L in (C) of FIG. 10) of the bent portion is set to be slightly larger than the length of the fins 23 provided on a first layer (layer disposed toward the heat-receiving plate 21) so as to keep the fins on the first layer from contact with a portion of the heat pipe 22 to which a second layer of the fins is fixed.

The heat pipe 22 has a bottom surface thereof fixed to the heat-receiving plate 21 by brazing. The heat pipe 22 is a plate-shaped pipe which is filled with liquid, such as fluorocarbon or the like, as a working fluid, for enhancing heat transfer efficiency.

As described above with reference to FIGS. 8 and 9, the heat-receiving plate 21 of the high-efficiency heat-dissipating fin section 20 is secured to a location opposed to the power amplifier unit 86 generating high-temperature heat with the heat-receiving plate 41 of the heat-dissipating fin section 40 disposed therebetween. Due to this construction, the high-temperature heat generated by the power amplifier unit 86 is transferred to the heat-receiving plate 21 of the high-efficiency heat-dissipating fin section 20.

The heat transferred to the heat-receiving plate 21 is transferred to the heat pipe 22. The heat transferred to the heat pipe 22 is transported in directions indicated by arrows in FIG. 10(B) due to temperature differences between the ends of the heat pipe 22. Accordingly, the heat generated by the power amplifier unit 86 is dissipated by the first and second layers of fins 23 rigidly fixed to the lower and upper portions of the heat pipe 22, respectively.

Figure 11:
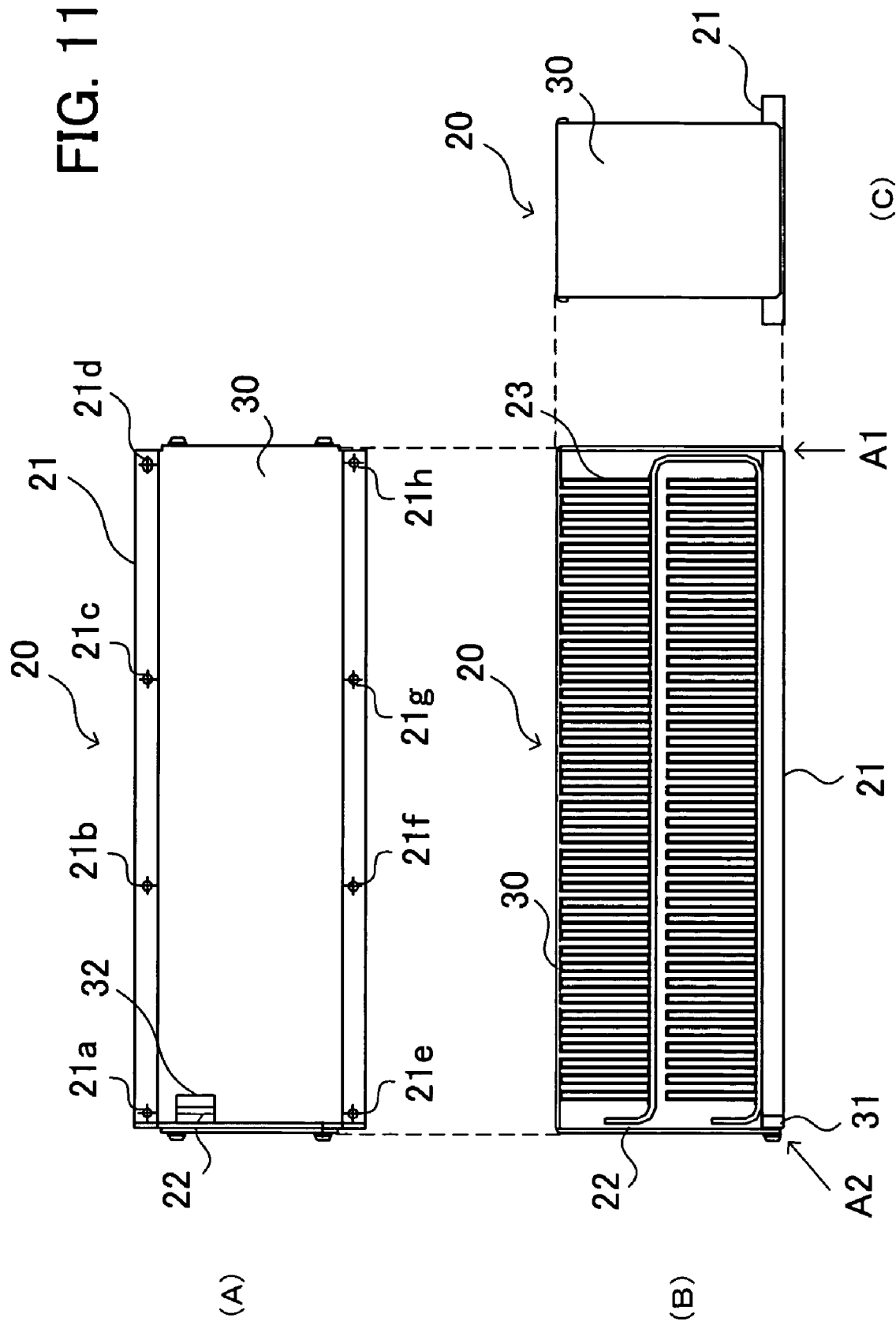
FIG. 11 is a diagram which is useful in explaining a protection cover covering the high-efficiency heat-dissipating fin section, in which (A) of FIG. 11 is a top view of the protection cover on the section, (B) of FIG. 11 is a front view of the same, and (C) of FIG. 11 is a side view of the same.

FIG. 11 is a diagram which is useful in explaining the protection cover covering the high-efficiency heat-dissipating fin section 20 in which (A) of FIG. 11 is a top view of the protection cover on the high-efficiency heat-dissipating fin section 20, (B) of FIG. 11 is a front view of the same, and (C) of FIG. 11 is a side view of the same.

The heat-receiving plate 21, the heat pipe 22, and the fins 23, shown in FIG. 11, are made of aluminum. Particularly, the heat pipe 22 and the fins 23 are small in thickness, which makes them vulnerable to an external force, and therefore there is a fear of being deformed thereby. To eliminate this inconvenience, as shown in the figure, the U-shaped protection cover 30 is rigidly fixed to the heat-receiving plate 21 in a manner covering the high-efficiency heat-dissipating fin section 20. At this time, the upper ends of the fins 23 rigidly fixed to the upper portion of the heat pipe 22 and the inside of the protection cover 30 are brazed to each other. That is, they are joined to each other such that both the thermal conduction and the fixing function are provided thereby. Further, an end (indicated by an arrow A1) of the heat-receiving plate 21 on a side of the bent portion of the heat pipe 22 and an end of the inside of the protection cover 30 are brazed to each other. On the other hand, an end (indicated by an arrow A2) of the heat-receiving plate 21 on a side of an end of the heat pipe 22 and the protection cover 30 are rigidly fixed to each other with screws, with a heat-resistant resin 31 having a low thermal conductivity interposed therebetween. The heat-resistant resin 31 is a silicone resin, for example. The heat-resistant resin is interposed because the temperature differences between the ends of the heat pipe 22 are reduced when the heat of the heat-receiving plate 21 is transferred to an end of the upper portion of the heat pipe 22 via the protection cover 30 and the fins 23, causing lowered heat-transporting efficiency.

As described hereinabove, the high-efficiency heat-dissipating fin section 20 is protected by the protection cover 30 without being decreased in heat dissipation efficiency. Further, the protection cover 30 and part of the fins 23 brazed to each other attains the reinforcement of the high-efficiency heat-dissipating fin section 20.

Further, a top surface of the protection cover 30 is formed with a hole 32 at a location corresponding to the end of the upper portion of the heat pipe 22. The hole 32 is used for filling liquid in the heat pipe 22 from the upper portion of the heat pipe 22 after the protection cover 30 has been rigidly fixed to the high-efficiency heat-dissipating fin section 20. The hole 32 is formed such that the liquid can be filled in the heat pipe 22 after the protection cover 30 has been brazed to the high-efficiency heat-dissipating fin section 20 since a temperature required for the brazing normally reaches 400 to 500° C. Therefore, the liquid is evaporated if the brazing is carried out after the liquid has been filled in the heat pipe 22.

It should be noted that the end of the upper portion of the heat pipe 22 may be extended downward and a hole may be formed through the heat-receiving plate 21 at a location corresponding to the end of the upper portion of the heat pipe. Due to this construction, the hole formed through the heat-receiving plate 21 is covered when the high-efficiency heat-dissipating fin section 20 is mounted on the heat-receiving plate 41 of the heat-dissipating fin section 40. This make it possible to prevent an external force deforming the protection cover 30 starting from a hole formed therethrough.

As shown in (A) of FIG. 11, the heat-receiving plate 21 of the high-efficiency heat-dissipating fin section 20 is formed with screw holes 21a to 21h, referred to hereinafter, for fixing the power amplifier unit 86 appearing in FIG. 8 to the heat-receiving plate 21 with the heat-receiving plate 41 of the heat-dissipating fin section 40 interposed therebetween.

Figure 12:
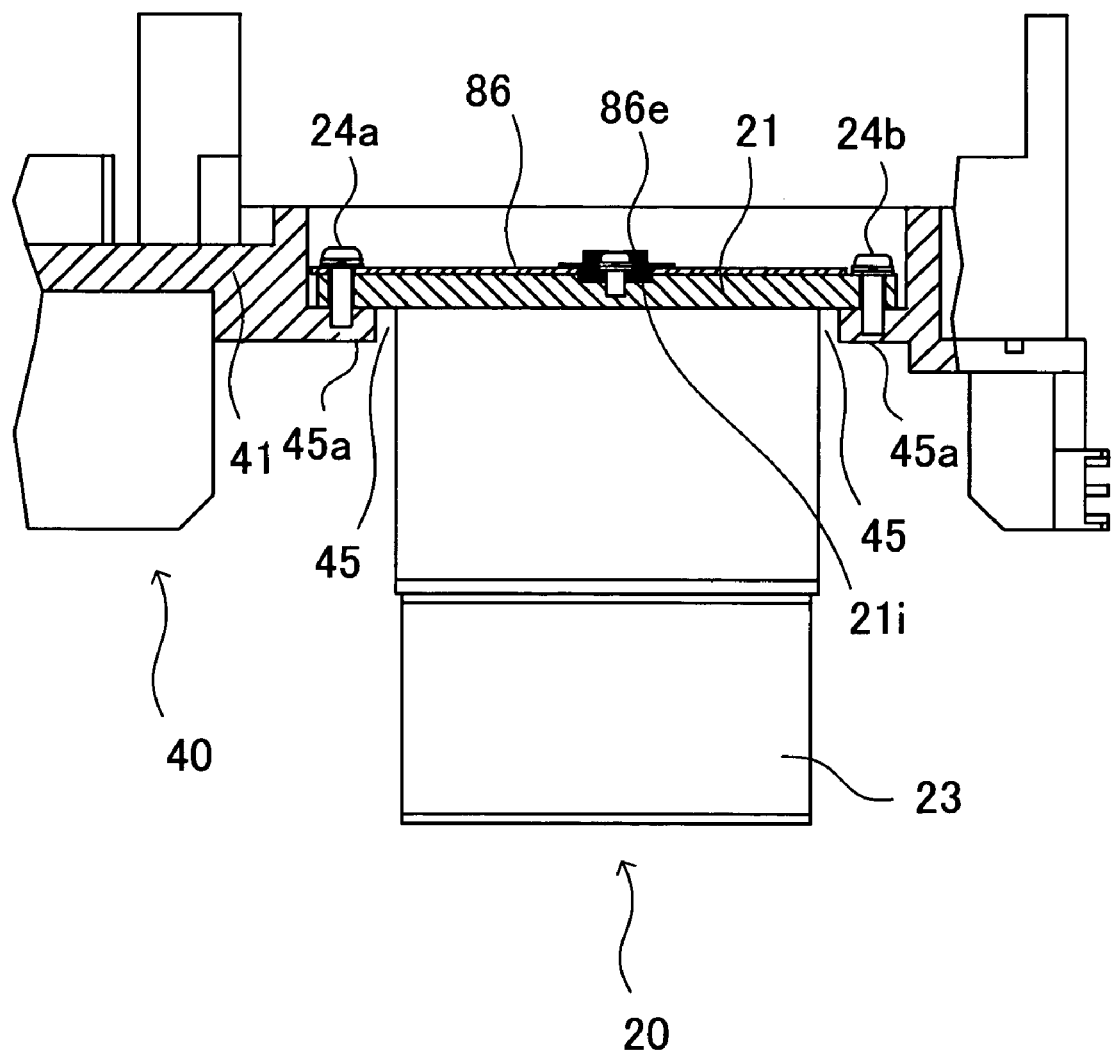
FIG. 12 is a cross-sectional view of part of the high-efficiency heat-dissipating fin section taken on line A—A of FIG. 9.

FIG. 12 is a cross-sectional view of the high-efficiency heat-dissipating fin section taken on line A—A of FIG. 9. As shown in FIG. 12, the heat-receiving plate 41 of the heat-dissipating fin section 40 is formed with a hole 45 for fitting the high-efficiency heat-dissipating fin section 20 therein. The hole 45 has a size large enough to allow the fins 23 of the high-efficiency heat-dissipating fin section 20 to pass therethrough and a flange 45a formed on the rim thereof, for having the periphery of the heat-receiving plate 21 fixed thereto. The periphery of the heat-receiving plate 21 is in contact with the flange 45a, and rigidly fixed to the same with screws 24a, 24b. Although only two screws are shown in FIG. 12, actually, three or more screws are used for fixing the periphery of the heat-receiving plate 21.

The power amplifier unit 86 is rigidly fixed to the heat-receiving plate 21 of the high-efficiency heat-dissipating fin section 20 with the screws 24a. The screws 24a also play the role of a shield by rigidly fixing the power amplifier unit 86 to the heat-receiving plate 21. Although in FIG. 12, only one screw 24a is shown as such a screw, actually, a plurality of screws 24a are used for fixing the power amplifier unit 86 to the heat receiving plate 21. It should be noted that the power amplifier unit 86 and the heat-receiving plate 21 are electrically insulated from each other.

The heat-receiving plate 21 of the high-efficiency heat-dissipating fin section 20 is formed with counterbores 21i such that the transistors 86a to 86g (the transistor 86e is shown in FIG. 12) of the power amplifier unit 86 shown in FIG. 9 are in direct contact with the heat-receiving plate 21.

As described above, the heat-receiving plate 41 of the heat-dissipating fin section 40 is formed with the hole 45, the power amplifier unit 86 is secured to the high-efficiency heat-dissipating fin section 20, and the transistors 86a to 86g which generate high-temperature heat are brought into contact with the heat-receiving plate 21. This makes it possible to attain the efficient dissipation of the high-temperature heat from the transistors. Further, since the hole 45 is formed through the heat-receiving plate 41 of the heat-dissipating fin section 40, the weight of the heat-receiving plate 41 is reduced, which contributes to weight reduction.

Now, when the power amplifier unit 86 is secured to the heat-receiving plate 21, the power amplifier unit 86 is required to be fixed such that the transistors 86a to 86g and a wiring pattern thereon are positioned to the counterbores 21i and the terminals of input/output connectors mounted on the heat-receiving plate 41 of the heat-dissipating fin section 40. This is because the electric characteristics of the power amplifier unit 86 are adversely affected by the displacement of positions of the transistors 86a to 86g and the terminals of the input/output connectors, since the power amplifier unit 86 deals with a high-frequency signal.

To eliminate the above inconvenience, the screw hole 21a shown in FIG. 11 has an accurate hole diameter with almost no play between the screw hole 21a and the screw for fixing the power amplifier unit 86. The screw hole 21d is a hole which has an elliptical shape longer in the direction of a straight line connecting the screw hole 21a and the screw hole 21d so as to absorb slight displacement of the power amplifier unit 86. The screw hole 21d has a minor diameter which is accurate and has almost no play between the screw hole 21d and the screw for fixing the power amplifier unit 86. This makes it possible to accurately position the power amplifier unit 86 in a direction perpendicular to the direction of the straight line connecting the screw hole 21a and the screw hole 21d. The screw holes 21b, 21c, and 21e to 21h have a diameter slightly larger than that of the screws for fixing the power amplifier unit 86 to provide a margin for displacement of the power amplifier unit 86.

It should be noted that when the size of the screws for fixing the power amplifier unit 86 is set to M3, the diameter of the screw hole 21a is 3.2 mm, and the diameter of the screw holes 21b, 21c, and 21e to 21h is 3.6 mm. The minor diameter of the screw hole 21d is 3.2 mm, and the major diameter of the same is 3.6 mm.

Figure 13:
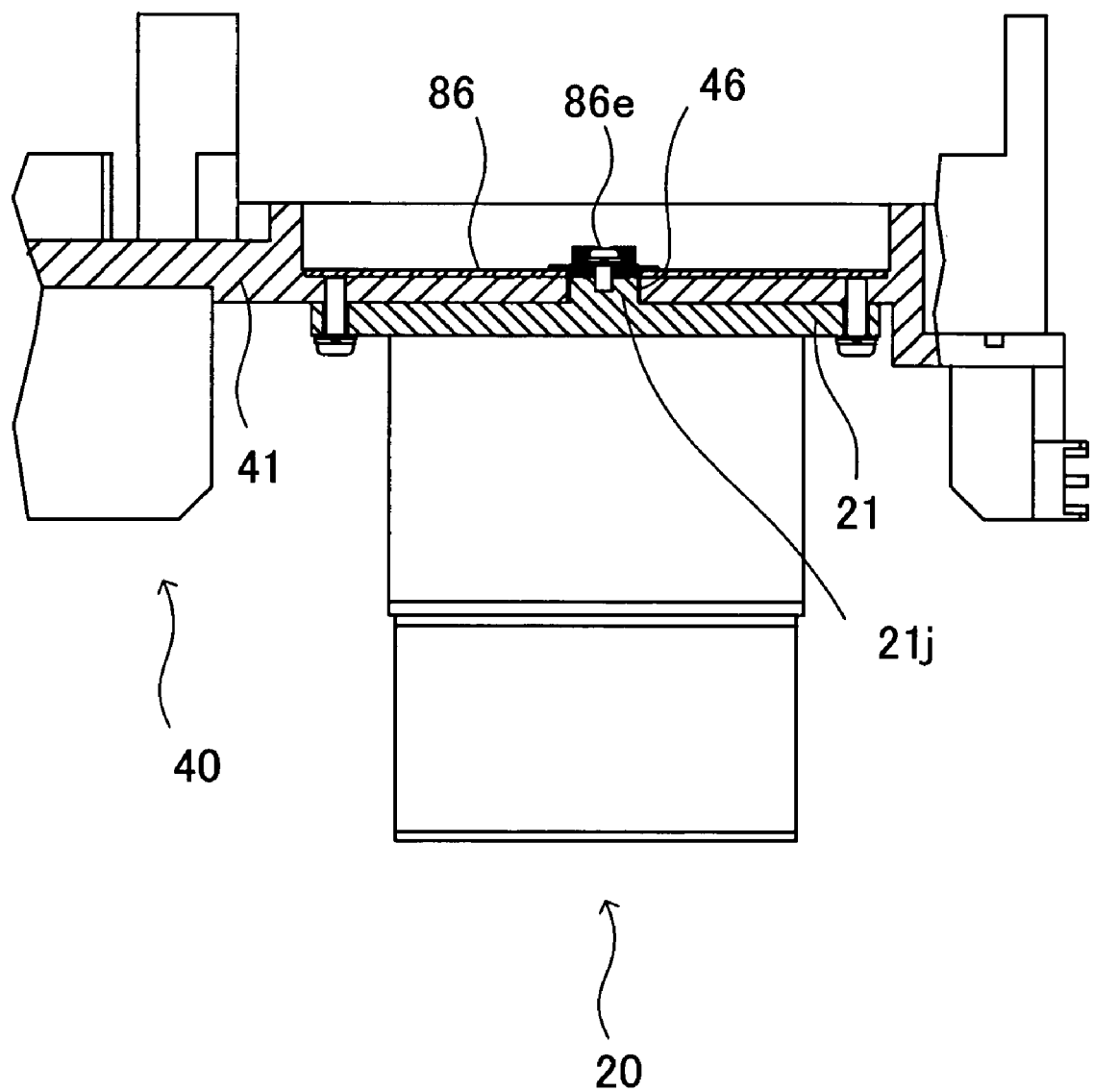
FIG. 13 is a diagram showing a variation of the high-efficiency heat-dissipating fin section shown in FIG. 12.

FIG. 13 is a diagram showing a variation of the construction shown in FIG. 12. As shown in FIG. 13, in this variation, the heat-receiving plate 41 of the heat-dissipating fin section 40 is formed with holes 46 having the respective sizes same as those of the transistors 86a to 86h (the transistor 86e is shown in FIG. 13) mounted on the power amplifier unit 86. The heat-receiving plate 21 of the high-efficiency heat-dissipating fin section 20 is formed with protrusions 21j for being fitted in the holes 46 formed through the heat-receiving plate 41 of the heat-dissipating fin section 40, respectively. The protrusions 21j are configured to be in contact with the transistors 86a to 86g, shown in FIG. 9, of the power amplifier unit 86.

As described above, the holes 46 having the same sizes as those of the transistors 86a to 86h of the power amplifier unit 86 are formed through the heat-receiving plate 41 of the heat-dissipating fin section 40, and the protrusions 21j are formed on the heat-receiving plate 21 of the high-efficiency heat-dissipating fin section 20, for being fitted in the holes 46, respectively, whereby the heat-receiving plate 21 and the transistors 86a to 86h are brought into direct contact with each other. This also contributes to efficient heat dissipation.

Figure 14:
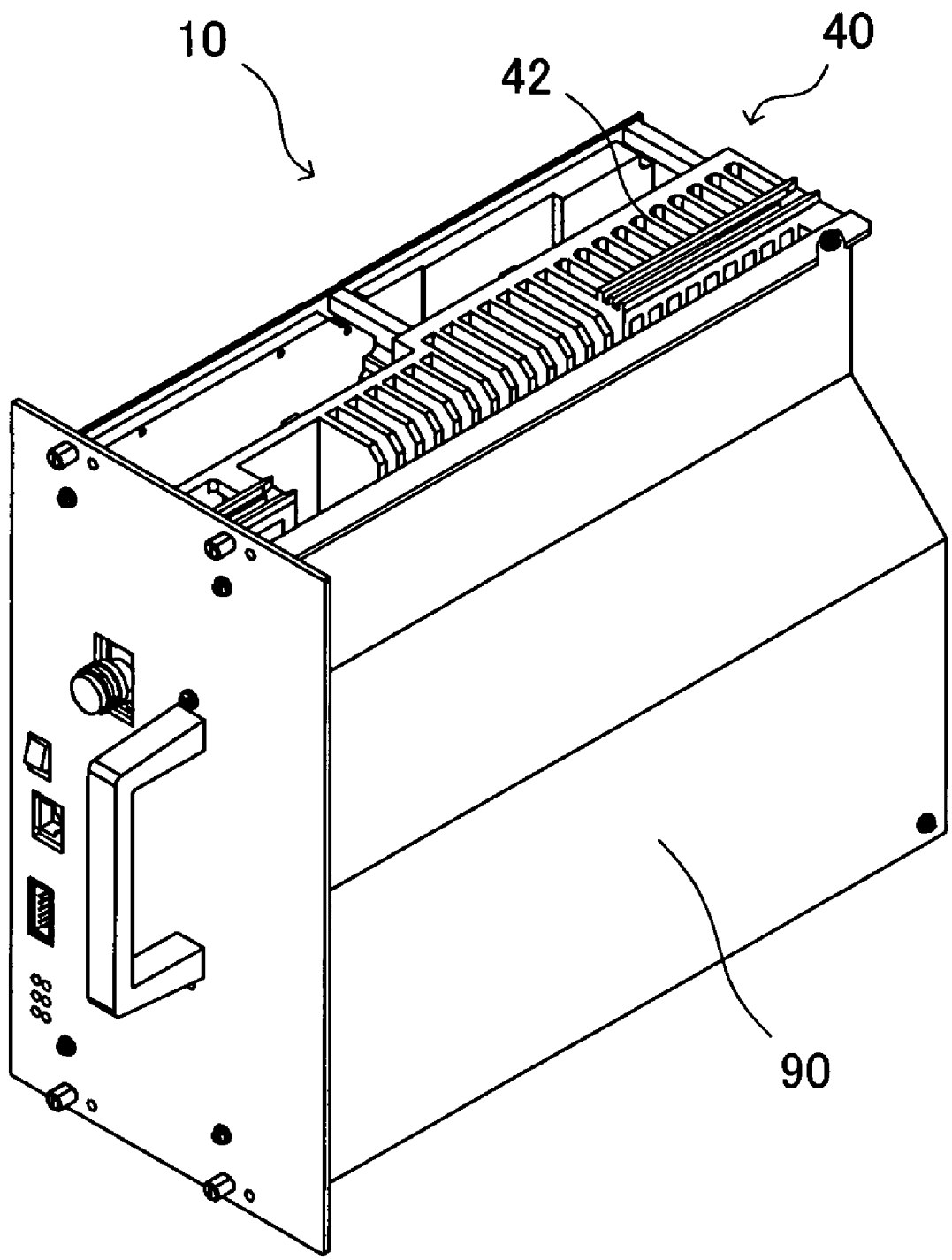
FIG. 14 is a perspective view of the communication device having a cover attached thereto.
Figure 15:
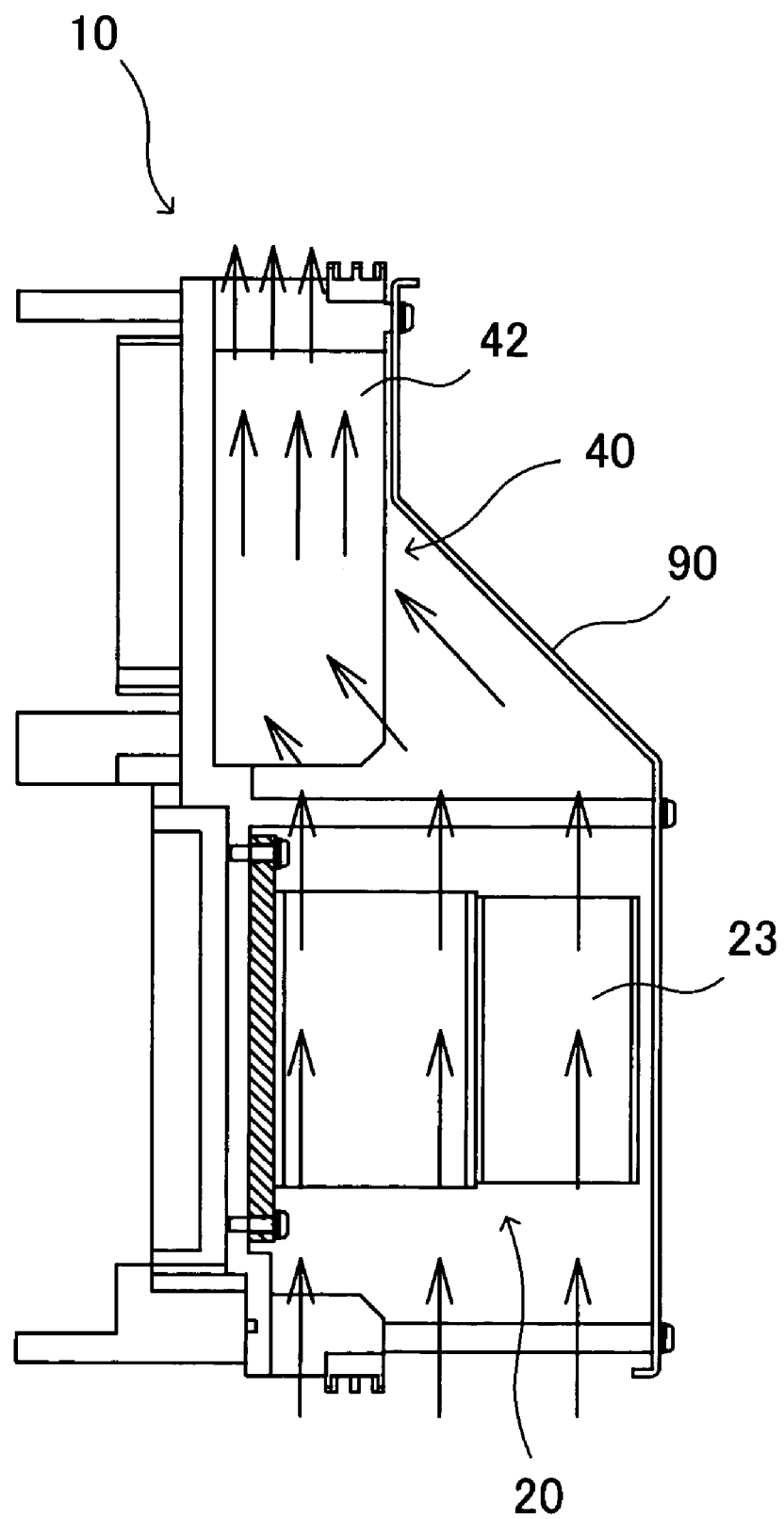
FIG. 15 is a view showing a cross-section of the communication device shown in FIG. 14 and a flow of air.

FIG. 14 is a perspective view showing the communication device having a cover mounted thereon. FIG. 15 is a cross-sectional view of the FIG. 14 communication device, which is useful in explaining a flow of air through the communication device. The communication device has a step-shaped cover 90 for covering the fins 23 of the high-efficiency heat-dissipating fin section 20 and the fins 42 of the heat-dissipating fin section 40, different in height. The cover 90 plays the role of a duct such that cooling air blown from the cooling fan 71 appearing in FIG. 2 passes between the fins 23 of the high-efficiency heat-dissipating fin section 20 and the fins 42 of the heat-dissipating fin section 40.

Figure 16:
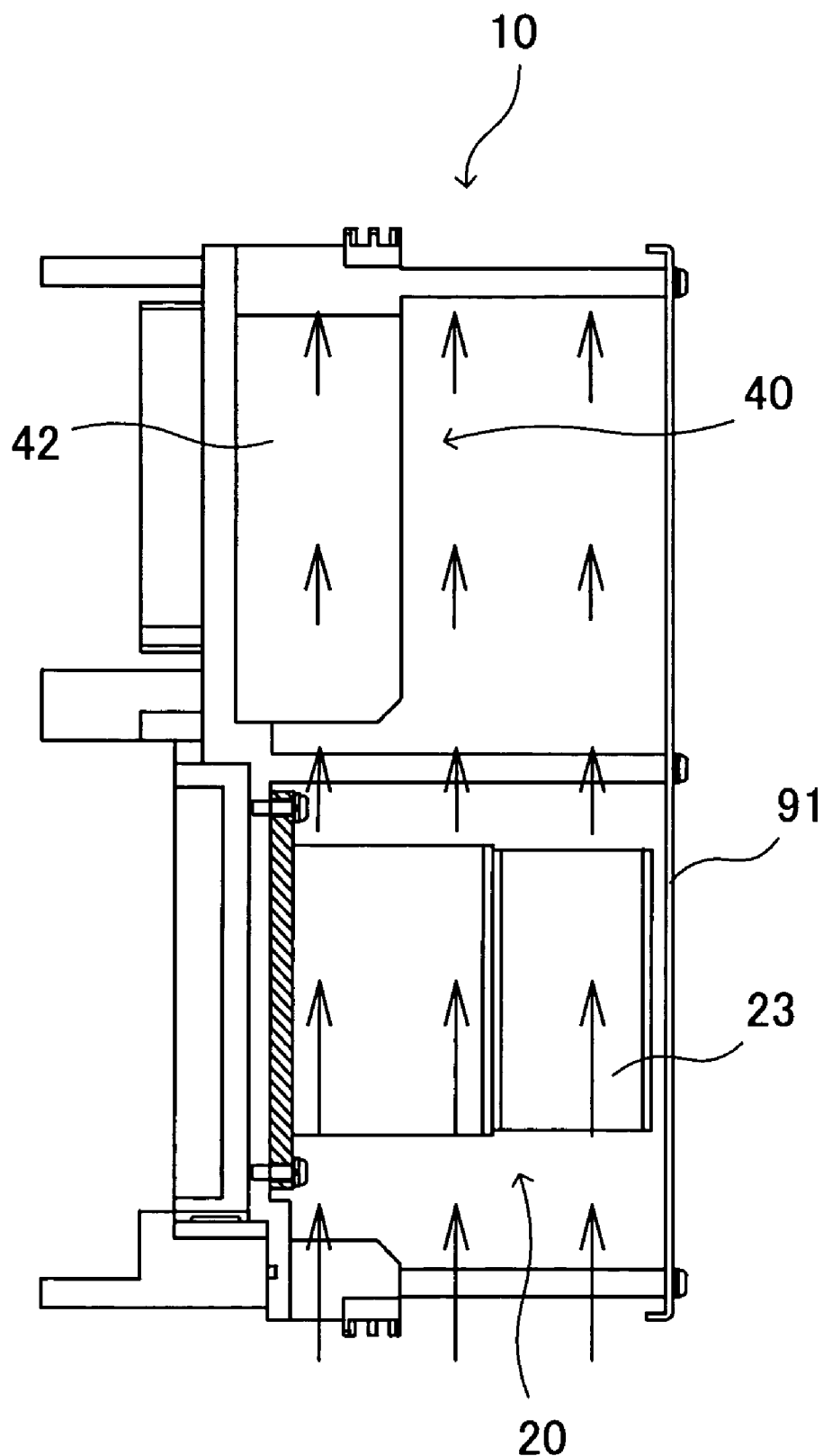
FIG. 16 is a cross-sectional view of the communication device, on which another cover is attached thereto, for comparison of flows of cooling air passing between fins.
Figure 17:
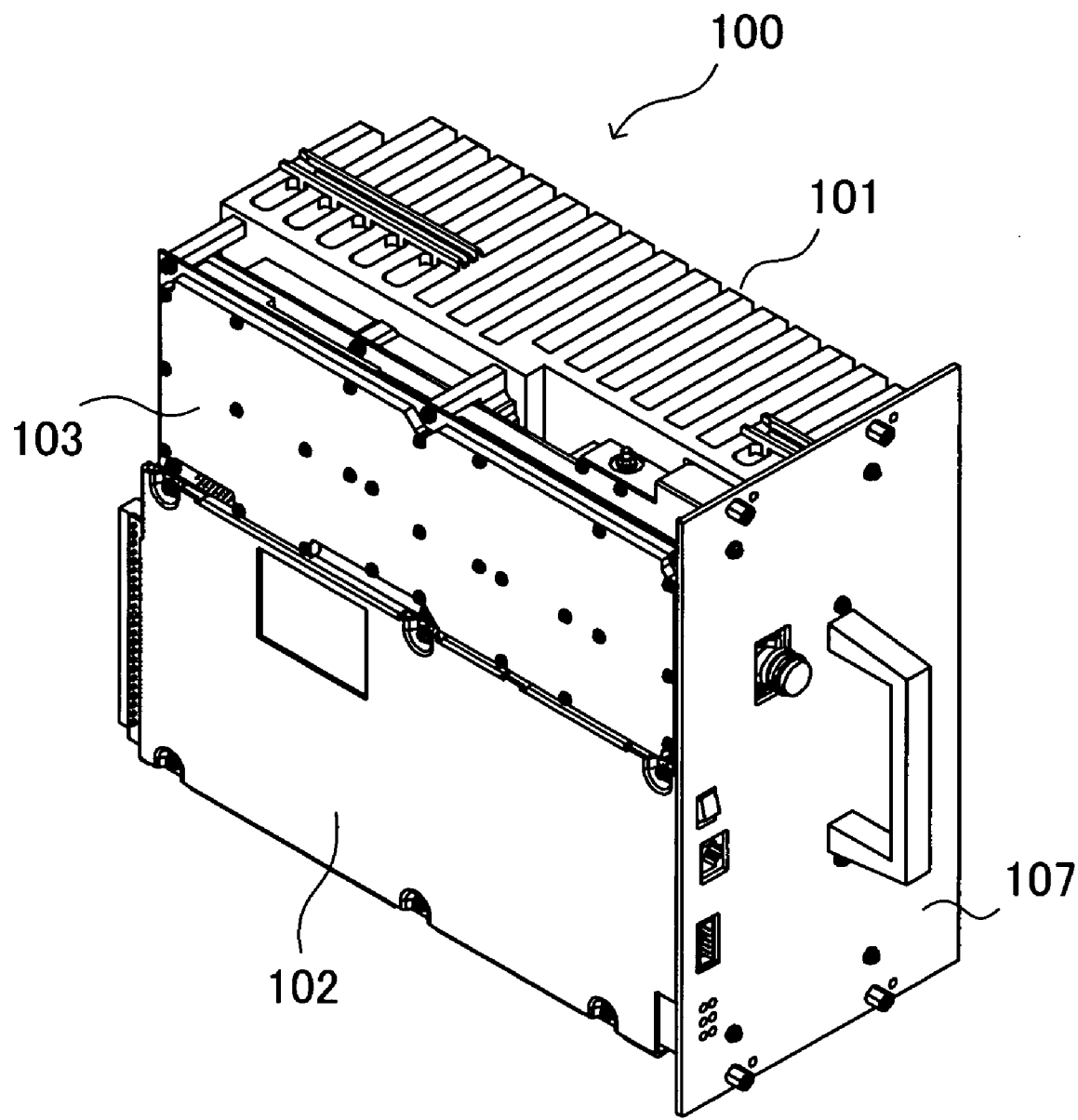
FIG. 17 is a perspective view showing an example of a conventional communication device having a heat-dissipating fin section mounted thereon.
Figure 18:
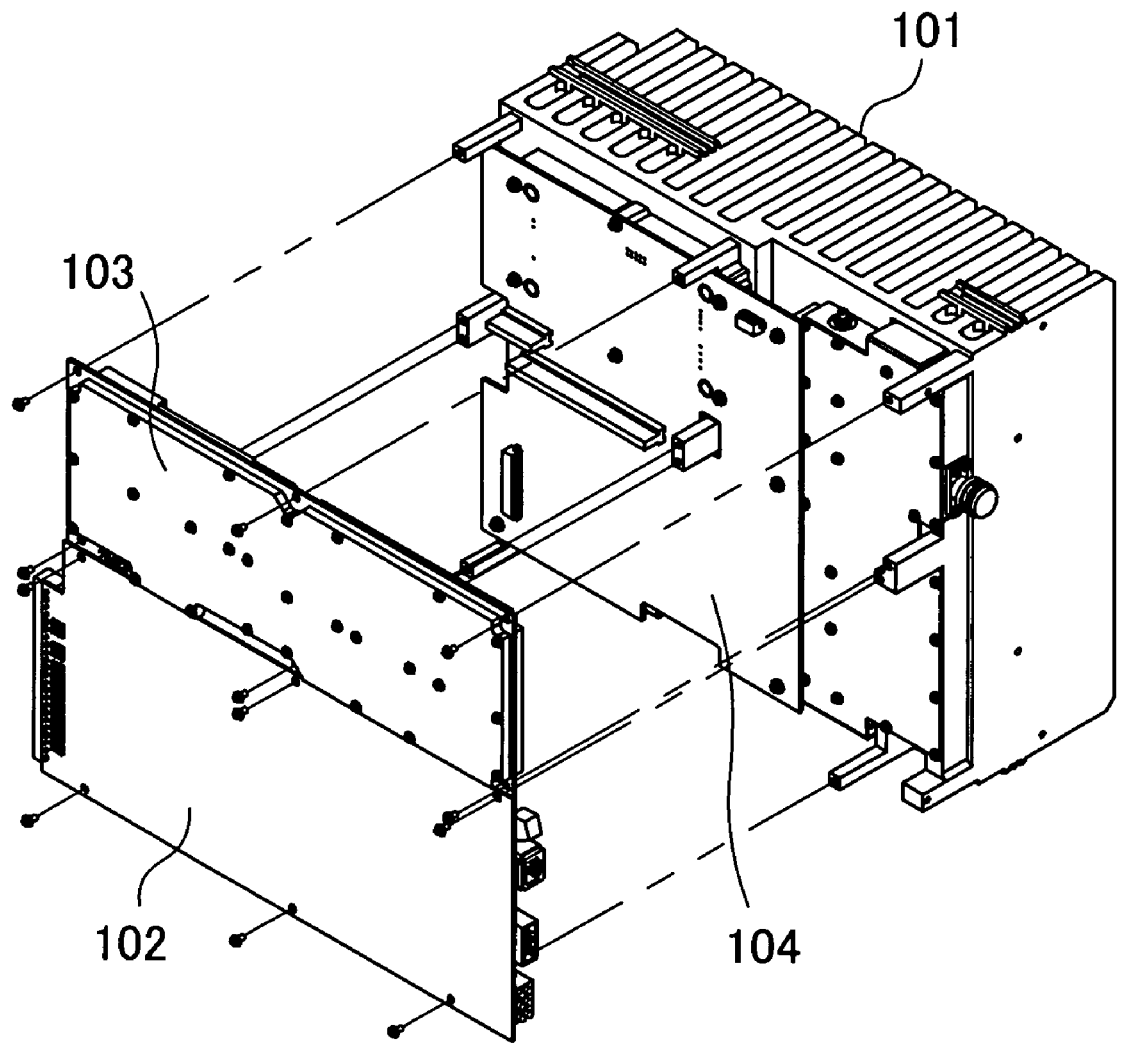
FIG. 18 is an exploded perspective view of the conventional communication device in a state in which a digital distortion-compensating unit and a converter unit are removed from the apparatus in the state shown in FIG. 17.
Figure 19:
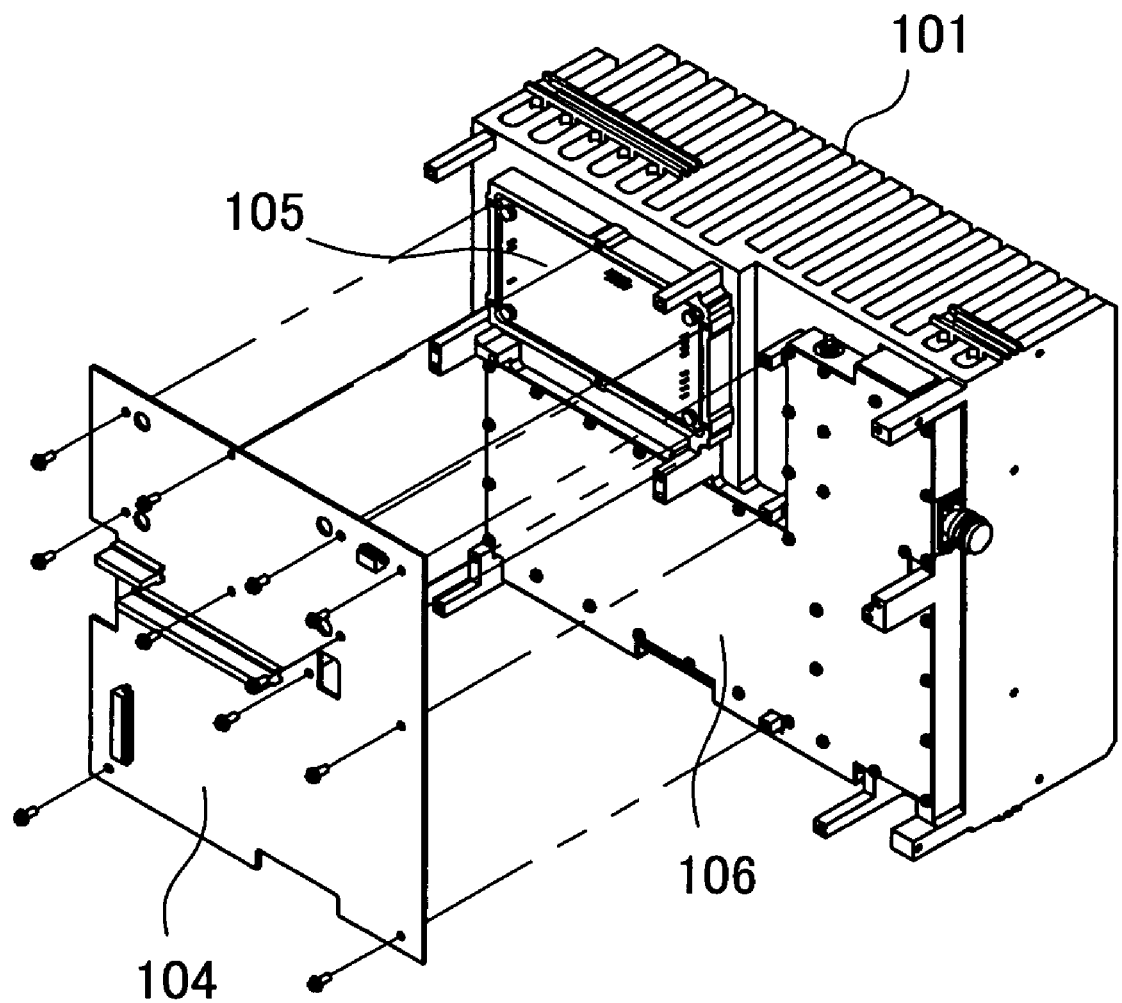
FIG. 19 is an exploded perspective view of the conventional communication device in a state in which a power supply is further removed from the apparatus in the state shown in FIG. 18.

FIG. 16 is a cross-sectional view of the communication device, on which another cover is attached thereto, for comparison of flows of cooling air passing between fins. As shown in FIG. 16, the cover 91 covering the communication device 10 of FIG. 16 is not configured to cover the fins 42 of the heat-dissipating fin section 40 although it is configured to cover the fins 23 of the high-efficiency heat-dissipating fin section 20.

On the other hand, the cover 90 in FIG. 15 is configured to cover the fins 23 of the high-efficiency heat-dissipating fin section 20 and the fins 42 of the heat-dissipating fin section 40, which causes cooling air having passed between the fins 23 to pass between the fins 42, as indicated by arrows in FIG. 15. However, the FIG. 16 cover 91 is not configured to cover the fins 42 of the heat-dissipating fin section 40, so that almost all cooling air having passed between the fins 23 is caused to pass outside an area of the fins 42 by resistance offered by the fins 42, as indicated by arrows in FIG. 16.

Thus, according to the preferred embodiment, the cover 90 covering the fins 23 of the high-efficiency heat-dissipating fin section 20 and the fins 42 of the heat-dissipating fin section 40 causes cooling air blown from the cooling fan 71 to pass between the fins 23 and the fins 42, whereby it is possible to attain efficient heat dissipation.

Further, by causing cooling air to pass between the fins 42 of the heat-dissipating fin section 40, it is possible to improve the heat dissipation efficiency of the fins 42, and thereby reduce the size and weight of the heat-dissipating fin section 40.

Further, assuming that the heat dissipation efficiency is enhanced without using the high-efficiency heat-dissipating fin section 20, that is, by using e.g. only one heat-dissipating fin section increased in the surface area of a heat-receiving plate thereof (the number of fins), there is an increased pressure loss of cooling air blown from the cooling fan 71. This makes it necessary to increase the capacity of the cooling fan 71 appearing in FIG. 2. In the present invention, however, the high-efficiency heat-dissipating fin section 20 is mounted on or provided for the high-temperature heat-generating section, and the heat-dissipating fin section 40 is mounted on or provided for the low-temperature heat-generating section, which makes it possible to reduce the size of the fins 42 of the heat-dissipating fin section 40, and thereby reduce the pressure loss of cooling air. Therefore, it is not necessary to use the cooling fan 71 increased in capacity, which contributes to cost reduction.

Furthermore, when heat dissipation is carried out for both of the high-temperature heat-generating section and the low-temperature heat-generating section using only one heat-dissipating fin section without using the high-efficiency heat-dissipating fin section 20, it is necessary to design the high-temperature heat-generating section such that it is located closer to the cooling fan 71 than the low-temperature heat-generating section, which causes the degree of freedom in design to be lost. This is because heat is transferred from a high temperature side to a low temperature side, and for efficient heat dissipation, it is necessary to allow heat generated by the high-temperature heat-generating section to be transferred to fins at a location corresponding to the low-temperature heat-generating section (if the high-temperature heat-generating section is disposed leeward of the low-temperature heat-generating section, the direction of flow of air is opposite to the direction of transfer of heat, and no fins are provided at a location leeward of the high-temperature heat-generating section, which makes it to impossible to perform efficient dissipation using the cooling fan 71). In the present invention, the high-efficiency heat-dissipating fin section 20 is mounted on or provided for the high-temperature heat-generating section, and the heat-dissipating fin section 40 is mounted on or provided for the low-temperature heat-generating section, to thereby enhance the heat dissipation efficiency of the communication device. This makes it possible to design the communication device such that the high-temperature heat-generating section is located leeward of the low-temperature heat-generating section, and therefore prevent the degree of freedom in design from being lost. It should be noted that although in the communication device 10 described above, the high-temperature heat-generating section and the low-temperature heat-generating section are located on the windward side and the leeward side, respectively, with respect to the flow of cooling air blown by the cooling fan 71, this is not limitative, but their positions may be reversed.

As described hereinbefore, according to the present invention, a first heat-dissipating fin section, which includes fins provided on a heat pipe, for efficient heat dissipation, is mounted on or provided for a high-temperature heat-generating section that generates high-temperature heat, while a second heat-dissipating fin section, which includes fins provided on a heat-receiving plate, is mounted on or provided for a low-temperature heat-generating section that generates low-temperature heat.

As a result, it is possible to efficiently dissipate heat locally generated, without producing portions of the heat-dissipating fin section to which the heat is not uniformly transferred due to an increase in the size of the heat-dissipating fin section.

Further, since the high-temperature heat generated by the high-temperature heat-generating section is efficiently dissipated by the first heat-dissipating fin section, the second heat-dissipating fin section is only required to have a shape suitable for dissipation of the heat generated by the low-temperature heat-generating section. This makes it possible to reduce the size and weight of the communication device.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A communication device that generates heat, comprising:
   a high-temperature heat-generating section that generates high-temperature heat;
   a first heat-dissipating fin section mounted on said high-temperature heat-generating section, said first heat-dissipating fin section having a heat pipe and fins provided on said heat pipe;
   a low-temperature heat-generating section that generates low-temperature heat having a lower temperature than that of the high-temperature heat generated by said high-temperature heat-generating section;
   a second heat-dissipating fin section mounted on said low-temperature heat-generating section, said second heat-dissipating fin section having a heat-receiving plate, and fins provided on said heat-receiving plate; and
   a protection cover for covering said first heat-dissipating fin section, wherein
   said fins provided on said heat pipe are fixed to said protection cover,
   said first heat-dissipating fin section has a heat-receiving plate having said heat pipe disposed thereon, and
   said protection cover is fixed to said heat-receiving plate having said heat pipe disposed thereon, via a heat-resistant resin having a low thermal conductivity.

2. The communication device as claimed in claim 1, wherein an inside of said protection cover and said fins of said first heat-dissipating tin section are rigidly fixed to each other by brazing.

3. The communication device as claimed in claim 1, wherein said first heat-dissipating fin section has a heat-receiving plate having said heat pipe disposed thereon,
   wherein said high-temperature heat-generating section includes a printed board, and
   wherein said printed board is rigidly fixed to said heat-receiving plate having said heat pipe disposed thereon.

4. The communication device as claimed in claim 1, wherein said first heat-dissipating fin section has a beat-receiving plate having said heat pipe disposed thereon,
   wherein said high-temperature heat-generating section includes components that generate heat, and
   wherein said components are in contact with said heat-receiving plate having said heat pipe disposed thereon.

5. The communication device as claimed in claim 4, wherein said components are transistors.

6. A communication device that generates heat, comprising:
   a high-temperature heat-generating section that generates high-temperature heat;
   a first heat-dissipating fin section mounted on said high-temperature heat-generating section, said first hear-dissipating fin section having a heat pipe and fins provided on said heat pipe;
   a low-temperature hear-generating section that generates low-temperature heat having a lower temperature than that of the high-temperature heat generated by said high-temperature heat-generating section;
   a second heat-dissipating fin section mounted on said low-temperature heat-generating section, said second heat-dissipating fin section having a heat-receiving plate, and fins provided on said heat-receiving place; and
   an air duct cover for covering said fins of said first heat-dissipating fin section and said fins of said second heat-dissipating fin section to cause air from a cooling fan to pass between said fins of said first heat-dissipating fin section and said fins of said second heat-dissipating fin section.

* * * * *